United States Patent [19]
Yoshino

[11] Patent Number: 5,198,373
[45] Date of Patent: Mar. 30, 1993

[54] PROCESS FOR FABRICATING A SEMICONDUCTOR DEVICE

[75] Inventor: Kazuhiko Yoshino, Tenri, Japan

[73] Assignee: Sharp Kabushiki Kaisha, Osaka, Japan

[21] Appl. No.: 886,399

[22] Filed: May 21, 1992

[30] Foreign Application Priority Data

May 21, 1991 [JP] Japan .................................. 3-116157

[51] Int. Cl.$^5$ ..................... H01L 21/265; H01L 29/70
[52] U.S. Cl. ........................................ 437/31; 437/24; 148/DIG. 10; 148/DIG. 11
[58] Field of Search ...................... 437/31, 24; 148/10, 148/11

[56] References Cited

U.S. PATENT DOCUMENTS

| | | | |
|---|---|---|---|
| 4,495,512 | 1/1985 | Isaac et al. | 437/31 |
| 4,980,305 | 12/1990 | Kadota et al. | 437/31 |
| 5,010,026 | 4/1991 | Gomi | 437/31 |

FOREIGN PATENT DOCUMENTS 2209872  5/1989  United Kingdom .................. 437/31

Primary Examiner—Mary Wilczewski
Assistant Examiner—Long Pham

[57] ABSTRACT

A process for fabricating a semiconductor device basically includes forming a boron implanted layer intended to be a base region by implanting boron ions to a substrate through a first opening, implanting fluorine ions to the substrate through a second opening serving to define an emitter-inner base formation region beneath the second opening and in the boron implanted layer to lower the boron ion concentration of that region only thereby lowering the peak carrier concentration of an inner base region than that of an emitter region to be formed later, and doping the region defined by a third opening with arsenic ions to form the emitter region with the inner base region underlying.

2 Claims, 4 Drawing Sheets

PROCESS FOR FABRICATING A SEMICONDUCTOR DEVICE

FIELD OF THE INVENTION

The present invention relates to a process for fabricating semiconductor devices, and more particularly to a process for fabricating high-speed bipolar transistors and their Integrated Circuits.

RELATED ART

A conventional process for fabricating a bipolar transistor (NPN transistor) is described with reference to FIGS. 9-11 which illustrate the process in time-sequence.

Referring to FIG. 9, a window is opened on a P-type semiconductor substrate 21 having a film oxide (not shown), and through this window a N-type impurity is diffused so as to form a N+ buried layer 22. After removal of the film oxide, an epitaxial layer is grown on the entire substrate surface to form a N type epitaxial layer 23 over the N+ buried layer 22. Subsequently a film oxide 24 is grown on the N+ epitaxial layer 23, windows are opened in predetermined portions of the film oxide 24, respectively and a P-type impurity is diffused through the windows to form P+ isolation diffusion layers 25. A N+ impurity is then diffused to form a collector region 26 extending from a top surface of the N-type epitaxial layer 23 down to a top portion of the N+ buried layer 22.

As shown in FIG. 10, the film oxide 24 is patterned and etched to form an opening 24a through which boron ions are implanted to form a base region 27.

As shown in FIG. 11, another film oxide 25 is grown on the opening 24a and etched to form another opening 25a through which arsenic ions are implanted to form an emitter region 28. Thereafter, a $SiO_2$ film is grown over the entire substrate surface, followed by formation of electrodes (not shown) for the collector, base and emitter, respectively. Thus, a NPN transistor is completed.

To improve transistor properties, especially the operation speed, the ion concentration of the base region is necessarily made lower than that of the emitter region. With the above process, however, making the ion concentration as such causes the base resistance to increase, hence inhibiting enhancement of the operation speed.

SUMMARY OF THE INVENTION

The present invention has been accomplished in view of the foregoing situation, and aims to provide a novel process with which the problems attributable to the prior art can be overcome.

Thus, the present invention provides a process for fabricating a semiconductor device, which comprises the steps of:

(i) forming a collector region in a semiconductor substrate covered with a first thin film;

(ii) forming a first opening in the first thin film and implanting boron ions to the semiconductor substrate through the first opening to form a boron implanted layer;

(iii) oxidizing the first opening to cover it with a second thin film, forming a second opening in the second thin film, and implanting fluorine ions to the semiconductor substrate through the second opening so as to lower the boron ion concentration of a region of the boron implanted layer existing beneath the second opening than that of the other region of the boron implanted layer;

(iv) subjecting the semiconductor substrate to a heat treatment to diffuse the implanted ions and cover the substrate surface including the second opening with a third thin film;

(v) etching to remove the third thin film entirely to form a third opening in the same position as the second opening; and (vi) doping a region defined by the third opening with arsenic ions to form an emitter region in that region while defining an inner base region beneath the emitter region and an outer base region which encompasses the emitter region and the inner base region, the peak boron concentration of said inner base region being made lower than the peak arsenic concentration of said inner base region.

DETAILED DESCRIPTION OF THE PREFERRED EMBODIMENTS

Figure 1:
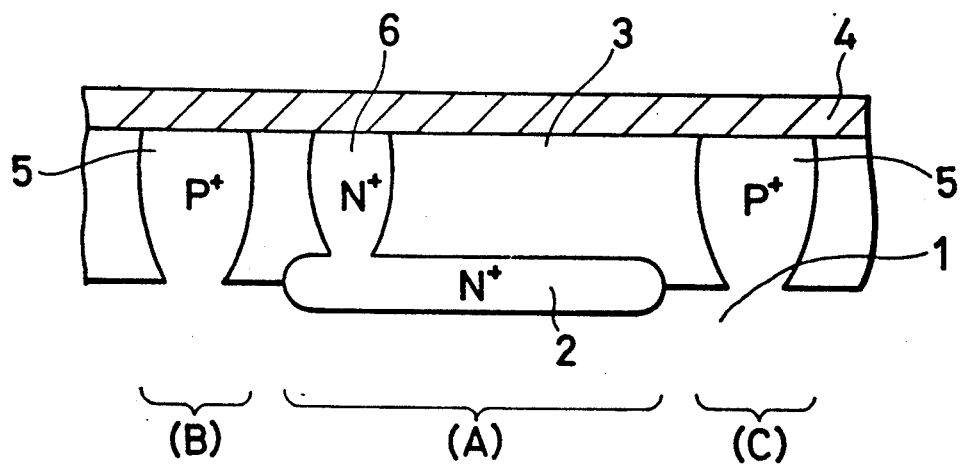
FIG. 1 is a schematic section for illustrating a first step of a semiconductor fabrication process as an embodiment of the invention.

The process of the present invention basically comprises forming the boron implanted layer intended to be a base region by implanting boron ions to the substrate through the first opening, implanting fluorine ions to the substrate through the second opening serving to define an emitter-inner bas formation region beneath the second opening and in the boron implanted layer to lower the boron ion concentration of that region only thereby lowering the peak carrier concentration of the inner base region than that of the emitter region to be formed later, and doping the region defined by the third opening with arsenic ions to form the emitter region with the inner base region underlying. According to the above process, the peak carrier concentration of the inner base region formed under the emitter region is made lower than those of the emitter region and the outer base region encompassing the emitter region and the inner base region, and hence the base resistance can be inhibited to increase.

In the present invention boron ions are implanted in a preferred dose of $6\times10^{14}$ to $2\times10^{15}$ ions/cm$^2$ to form the base region. Fluorine ions are implanted in a preferred dose of $2\times10^{15}$ to $1\times10^{16}$ ions/cm$^2$ to form the inner base region just under the emitter region. This fluorine ion implantation enables to make the peak carrier concentration of the base region (inner base region) lower than that of the emitter region. This is because the fluorine ion implantation within the boron implanted layer causes to make the silicon crystal structure amorphous, whereby the implanted boron ions are made to readily rediffuse into the second thin film (SiO$_2$). This results in an occurrence of reduction in the boron ion concentration of part (inner base region) of the base region existing beneath the second opening.

Thus, according to the invention the inner base region having a peak carrier concentration lower than the emitter region is formed just under the emitter region, with the outer base region having a peak carrier concentration higher than the inner base region and encompassing the emitter and inner base regions, thereby inhibiting an increase of the base resistance. This leads to an improvement of the transistor properties.

In the present invention the heat treatment is conducted by a known method. The heat treatment for diffusing the implanted ions as well as forming the third thin film covering the entire substrate surface including the second opening, is conducted by a so-called oxidation annealing technique under the following preferred conditions; atmosphere: O$_2$ or H$_2$O gas, pressure: 760 mmHg, and temperature: 850°-950° C. As a result of the oxidation annealing, the base region is formed.

The region defined by the third opening is doped with arsenic ions by, for example, forming a conductive film doped with arsenic ions on that region and subjecting the substrate to a heat treatment to diffuse the arsenic ions from the conductive film into such region. In this case the conductive film is doped with arsenic ions in a preferred dose of $6\times10^{15}$ to $2\times10^{16}$ ions/cm$^2$ and the heat treatment is conducted under the following preferred conditions; atmosphere: N$_2$ gas, pressure: 760 mmHg, and temperature: 900°-950° C. The emitter region is formed by the diffusion of the arsenic ions from the conductive film. The conductive is preferably made of polysilicon.

Now, an embodiment of the invention is to be described with reference to the drawings.

FIGS. 1-5 sequentially show a semiconductor device fabrication process embodied according to the invention. Referring to FIG. 1, a window is opened on a P-type semiconductor substrate 1 having a film oxide (not shown), and through this window a N-type impurity is implanted and diffused so as to form a N+ buried layer 2 in a region (A) of the substrate 1. After removal of the film oxide, an epitaxial layer is grown on the entire substrate surface to form a N+ epitaxial layer 3 over the N+ buried layer 2. Subsequently a film oxide 4 (first thin film) is grown to about 1000 Å thick on the N+ epitaxial layer 3, windows are opened in predetermined portions of the film oxide 4, respectively, and a P-type impurity is implanted through the windows and diffused to form P+ isolation diffusion layers 5 in regions (B) and (C), respectively. A N+ impurity is then implanted and diffused to form a collector region 6 extending from a top surface of the N-type epitaxial layer 3 down to a top portion of the N+ buried layer 2.

Figure 2:
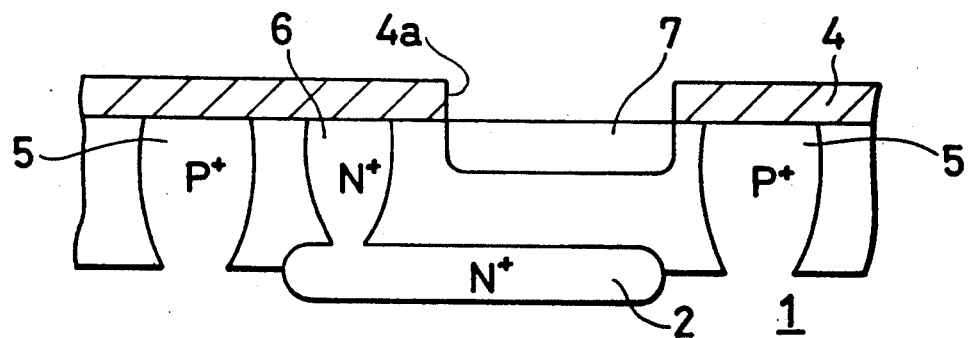
FIG. 2 is a schematic section for illustrating a second step of the embodiment.

As shown in FIG. 2, the film oxide 4 is patterned and etched to form a first opening 4a above the N+ buried layer 2 for defining a base region and through which opening 4a boron ions are implanted at an acceleration energy of 10 KeV in a dose of about $1.0\times10^{15}$ ions/cm$^2$ to form a boron implanted layer 7 to 0.2 μm deep.

Figure 3:
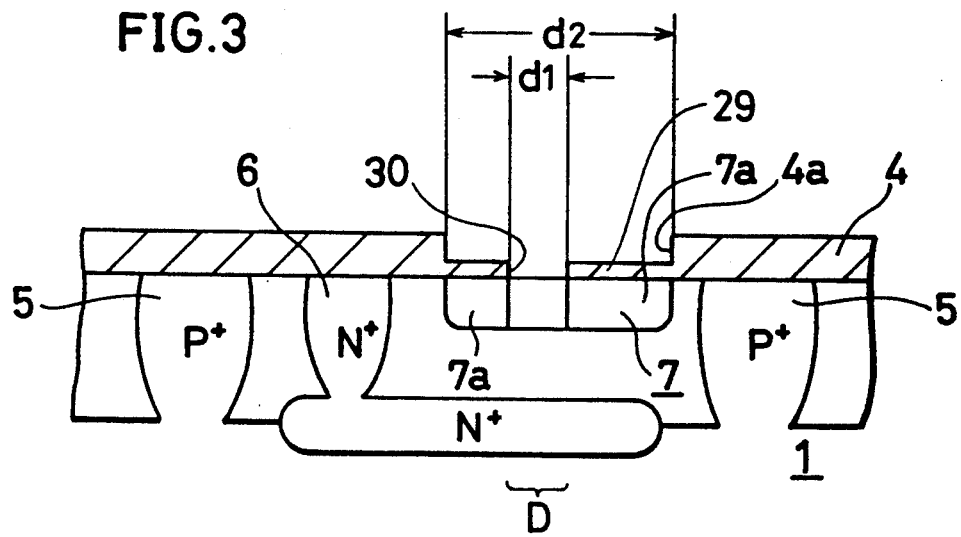
FIG. 3 is a schematic section for illustrating a third step of the embodiment.
Figure 4:
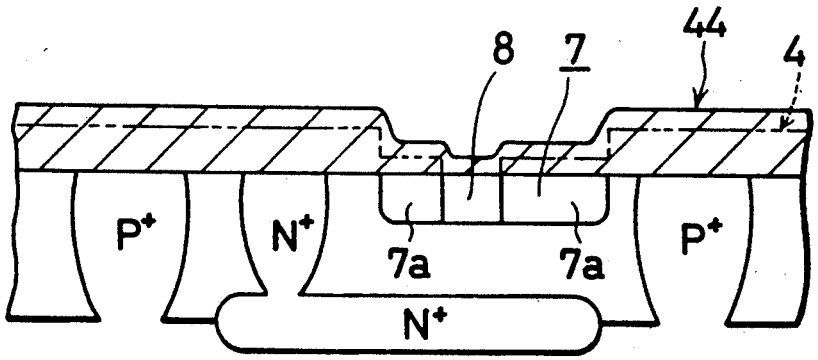
FIG. 4 is a schematic section for illustrating a fourth step of the embodiment.

As shown in FIG. 3, a second thin film (film oxide) 29 is grown to 1000 Å thick to cover the first opening 4a and etched by a known photoetching technique to remove a portion thereof in a region (D) to form a second opening 30. In this case the diameter d$_1$ of the second opening 30 is set to 1.2 μm, while the diameter d$_2$ ($>$d$_1$) of the first opening 4a is set to 7.0 μm. Through the second opening 30 fluorine ions are implanted at an acceleration energy of 10 KeV in a dose of about $2.0\times10^{15}$ ions/cm$^2$, followed by an oxidation annealing to diffuse the implanted ions. This fluorine ion implantation serves to lower the boron ion concentration of a region 8 of the boron implanted layer 7 beneath the second opening 30 as compared with that of the other region 7a of the boron implanted layer 8. This oxidation annealing forms a third thin film (film oxide) 44 over the second opening 30 as well as over the first thin film 4, as shown in FIG. 4.

Figure 5:
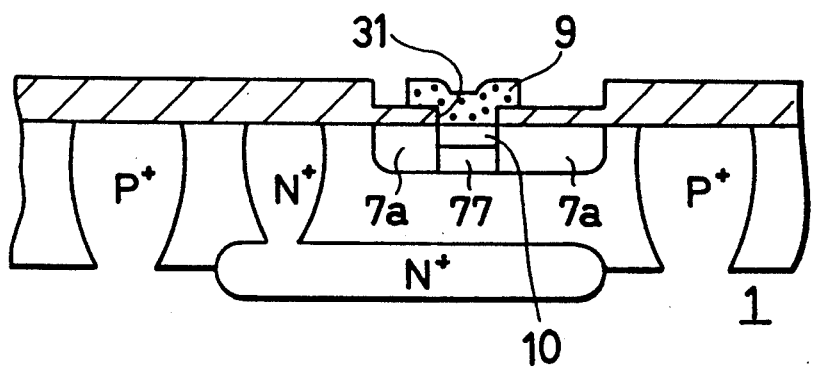
FIG. 5 is a schematic section for illustrating a fifth step of the embodiment.

In turn, as shown in FIG. 5, the third thin film 44 is etched to form a third opening 31 above the low concentration region 8, for defining an emitter region 10. Further, a polysilicon film 9, doped with arsenic in a dose of $1\times10^{16}$ ions/cm$^2$, is formed, patterned and annealed to diffuse arsenic ions therefrom to a region just under the third opening 31, so that the emitter region 10 is formed. The emitter region 10 may otherwise be formed by using ion implantation.

Figure 6:
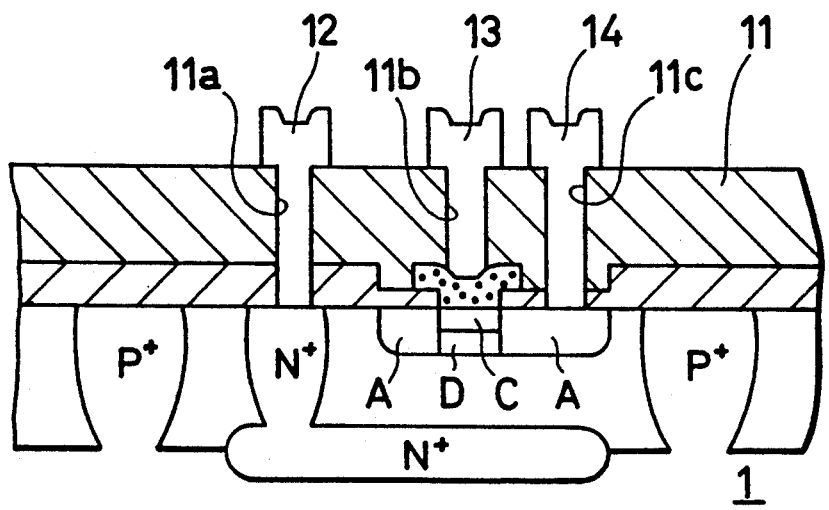
FIG. 6 is a schematic section for illustrating a sixth step of the embodiment.

Finally, as shown in FIG. 6, a protective film 11, such as of BPSG or the like, is formed to cover the entire substrate surface and patterned to form contact holes 11a, 11b and 11c, followed by formation of a collector electrode 12, emitter electrode 13 and base electrode 14 on the contact holes 11a, 11b and 11c, respectively. Thus, a NPN transistor is completed.

Figure 7:
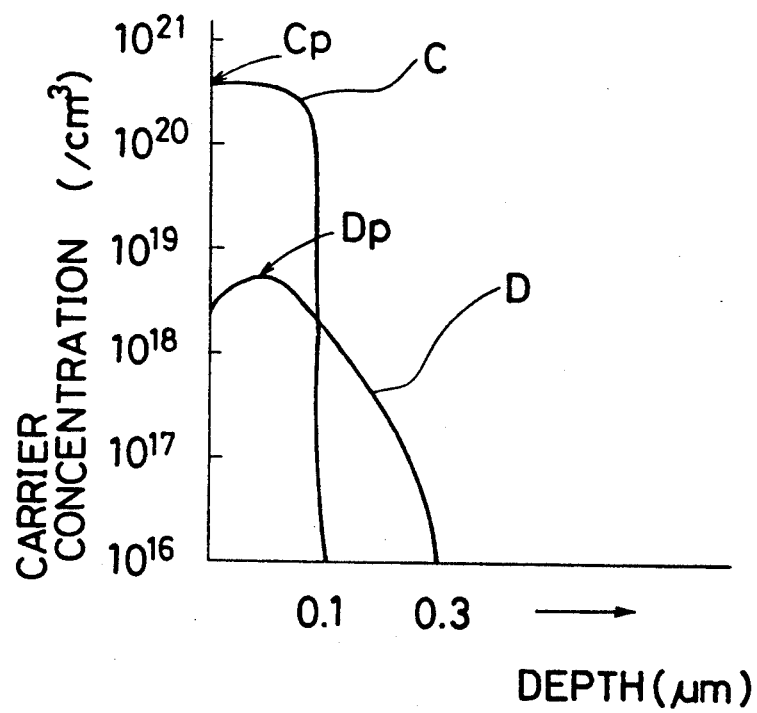
FIG. 7 is a graph showing carrier concentration curves with depth in an emitter region and an inner base region, respectively, according to the embodiment.
Figure 8:
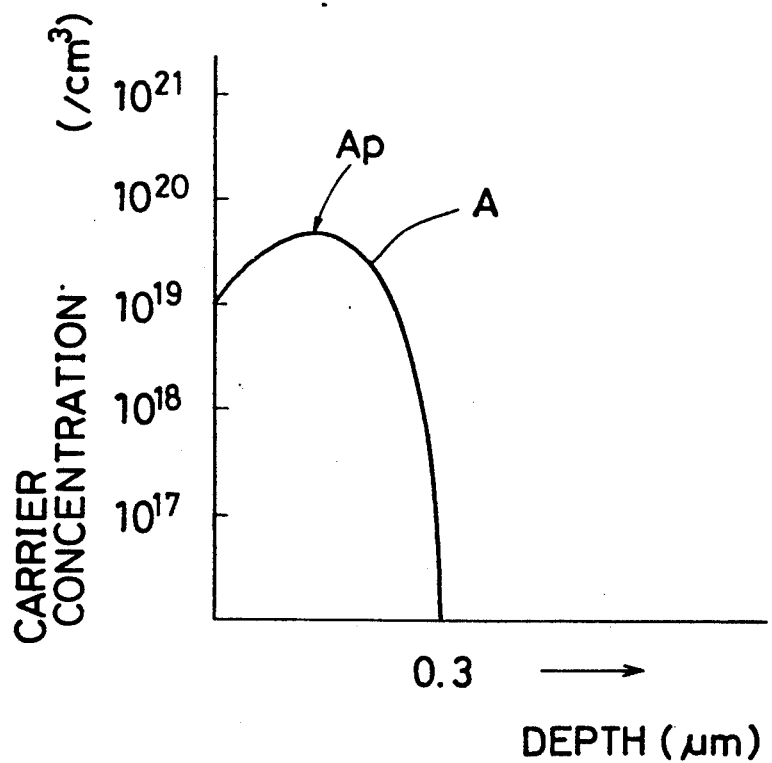
FIG. 8 is a graph showing a carrier concentration curve with depth in an outer base region, according to the embodiment.
Figure 9:
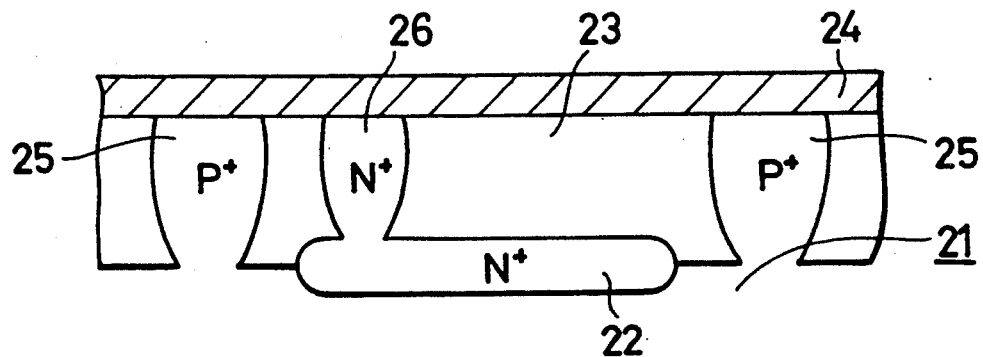
FIG. 9 is a schematic section for illustrating a first step of the prior art fabrication process.
Figure 10:
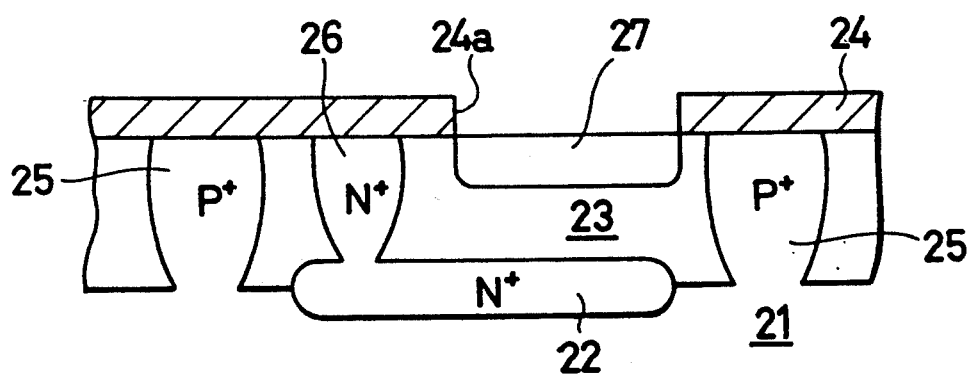
FIG. 10 is a schematic section for illustrating a second step of the prior art fabrication process.
Figure 11:
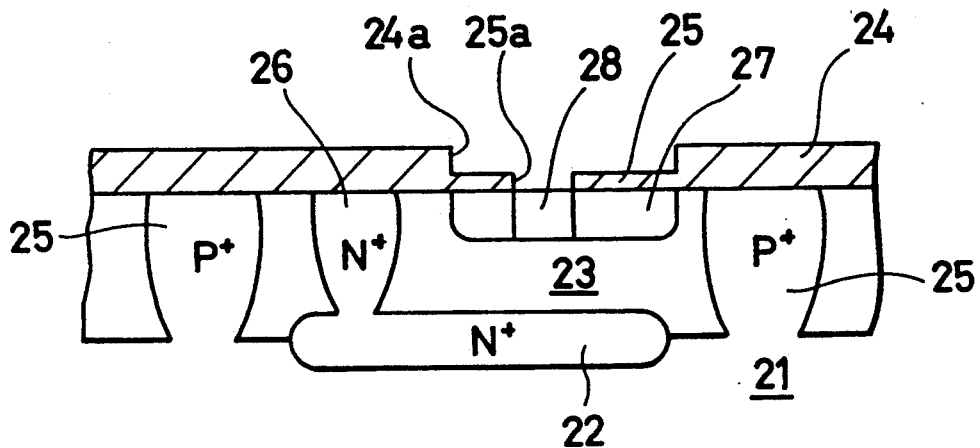
FIG. 11 is a schematic section for illustrating a third step of the prior art fabrication process.

As can be understood from FIG. 7, an inner base region (or an intrinsic base region), designated by a reference numeral 77 in FIG. 5, has a boron concentration D of which peak concentration D$_p$ (about $5\times10^{18}$/cm$^3$) is lower than a peak concentration C$_p$ (about $5\times10^{20}$/$^3$) of an arsenic concentration C of the emitter region 10. Further, an outer base region 7a has a boron concentration A of which peak concentration A$_p$ is about $5\times1019$/cm$^3$, as shown in FIG. 8. Note that the boron concentration D of the inner base region reaches its peak in the proximity of a junction with the emitter at a depth of 0.1 μm.

Thus, the process for fabricating a semiconductor device according to the present invention makes it possible to readily form a base region having a low peak concentration under an emitter region, hence contributing to the improvement on the transistor properties.

While only a certain presently preferred embodiment has been described in detail, as will be apparent with those familiar with the art, certain changes and modifications can be made without departing from the scope of the invention as defined by the following claims.

What we claim is:

1. A process for fabricating a semiconductor device, which comprises the steps of:
  (i) forming a collector region in a semiconductor substrate covered with a first thin film;
  (ii) forming a first opening in the first thin film and implanting boron ions to the semiconductor substrate through the first opening to form a boron implanted layer;

(iii) oxidizing the first opening to cover it with a second thin film, forming a second opening in the second thin film, and implanting fluorine ions to the semiconductor substrate through the second opening so as to lower the boron ion concentration of a region of the boron implanted layer existing beneath the second opening than that of the other region of the boron implanted layer;

(iv) subjecting the semiconductor substrate to a heat treatment to diffuse the implanted ions and cover the substrate surface including the second opening with a third thin film;

(v) etching to remove the third thin film entirely to form a third opening in the same position as the second opening; and (vi) doping a region defined by the third opening with arsenic ions to form an emitter region in that region while defining an inner base region beneath the emitter region and an outer base region which encompasses the emitter region and the inner base region, the peak boron ion concentration of said inner base region being made lower than the peak arsenic ion concentration of said inner base region.

2. A process as set forth in claim 1, wherein the peak boron ion concentration of the outer base region is about $5 \times 10^{19}/cm^3$; the peak boron ion concentration of the inner base region is about $5 \times 10^{18}/cm^3$; and the peak arsenic ion concentration of the emitter is about $5 \times 10^{20}/^3$, which value is higher than any of the respective peak boron concentrations of the outer and inner base regions.

* * * * *